(12) United States Patent
Lee et al.

(10) Patent No.: US 10,937,894 B2
(45) Date of Patent: Mar. 2, 2021

(54) STRUCTURE OF A FIN FIELD EFFECT TRANSISTOR (FINFET)

(71) Applicant: Taiwan Semiconductor Manufacturing Company, Ltd., Hsinchu (TW)

(72) Inventors: Wei-Yang Lee, Taipei (TW); Chih-Shan Chen, New Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/741,315

(22) Filed: Jan. 13, 2020

(65) Prior Publication Data

US 2020/0152775 A1    May 14, 2020

Related U.S. Application Data

(60) Continuation of application No. 16/222,583, filed on Dec. 17, 2018, now Pat. No. 10,535,757, which is a continuation of application No. 15/392,633, filed on Dec. 28, 2016, now Pat. No. 10,158,006, which is a division of application No. 14/828,296, filed on Aug.

(Continued)

(51) Int. Cl.
| | |
|---|---|
| *H01L 29/66* | (2006.01) |
| *H01L 29/78* | (2006.01) |
| *H01L 27/08* | (2006.01) |
| *H01L 21/02* | (2006.01) |
| *H01L 29/165* | (2006.01) |
| *H01L 29/06* | (2006.01) |

(Continued)

(52) U.S. Cl.
CPC .... *H01L 29/66795* (2013.01); *H01L 21/0262* (2013.01); *H01L 21/02521* (2013.01); *H01L 21/02529* (2013.01); *H01L 21/02532* (2013.01); *H01L 21/02579* (2013.01); *H01L 21/3065* (2013.01); *H01L 27/0886* (2013.01); *H01L 29/0649* (2013.01); *H01L 29/165* (2013.01); *H01L 29/66636* (2013.01); *H01L 29/785* (2013.01); *H01L 29/7848* (2013.01); *H01L 29/7851* (2013.01)

(58) Field of Classification Search
CPC ........... H01L 29/66795; H01L 27/0886; H01L 29/785
USPC .......................................... 257/283; 438/570
See application file for complete search history.

(56) References Cited

U.S. PATENT DOCUMENTS

| | | | |
|---|---|---|---|
| 8,575,926 B2 | 11/2013 | Chao et al. | |
| 8,716,765 B2 | 5/2014 | Wu et al. | |

(Continued)

*Primary Examiner* — Didarul A Mazumder
(74) *Attorney, Agent, or Firm* — Slater Matsil, LLP

(57) ABSTRACT

A fin field effect transistor (FinFET) includes a fin extending from a substrate, where the fin includes a lower region, a mid region, and an upper region, the upper region having sidewalls that extend laterally beyond sidewalls of the mid region. The FinFET also includes a gate stack disposed over a channel region of the fin, the gate stack including a gate dielectric, a gate electrode, and a gate spacer on either side of the gate stack. A dielectric material is included that surrounds the lower region and the first interface. A fin spacer is included which is disposed on the sidewalls of the mid region, the fin spacer tapering from a top surface of the dielectric material to the second interface, where the fin spacer is a distinct layer from the gate spacers. The upper region may include epitaxial source/drain material.

20 Claims, 10 Drawing Sheets

Related U.S. Application Data 17, 2015, now Pat. No. 9,537,008, which is a continuation of application No. 14/144,198, filed on Dec. 30, 2013, now Pat. No. 9,112,033.

(51) Int. Cl.
*H01L 21/3065* (2006.01)
*H01L 27/088* (2006.01)

(56) References Cited

U.S. PATENT DOCUMENTS

| | | | |
|---|---|---|---|
| 8,889,497 B2 | 11/2014 | Chen et al. | |
| 8,896,063 B2 | 11/2014 | Adam et al. | |
| 9,112,033 B2 * | 8/2015 | Lee | H01L 29/66795 |
| 9,136,383 B2 | 9/2015 | Wann et al. | |
| 2008/0296702 A1 * | 12/2008 | Lee | H01L 29/66795 |
| | | | 257/401 |
| 2011/0073952 A1 * | 3/2011 | Kwok | H01L 29/7848 |
| | | | 257/368 |
| 2014/0042500 A1 * | 2/2014 | Wann | H01L 29/165 |
| | | | 257/288 |
| 2015/0041855 A1 * | 2/2015 | Liao | H01L 29/161 |
| | | | 257/192 |
| 2015/0187943 A1 | 7/2015 | Lee et al. | |
| 2015/0357469 A1 | 12/2015 | Lee et al. | |
| 2017/0110558 A1 | 4/2017 | Lee et al. | |

\* cited by examiner

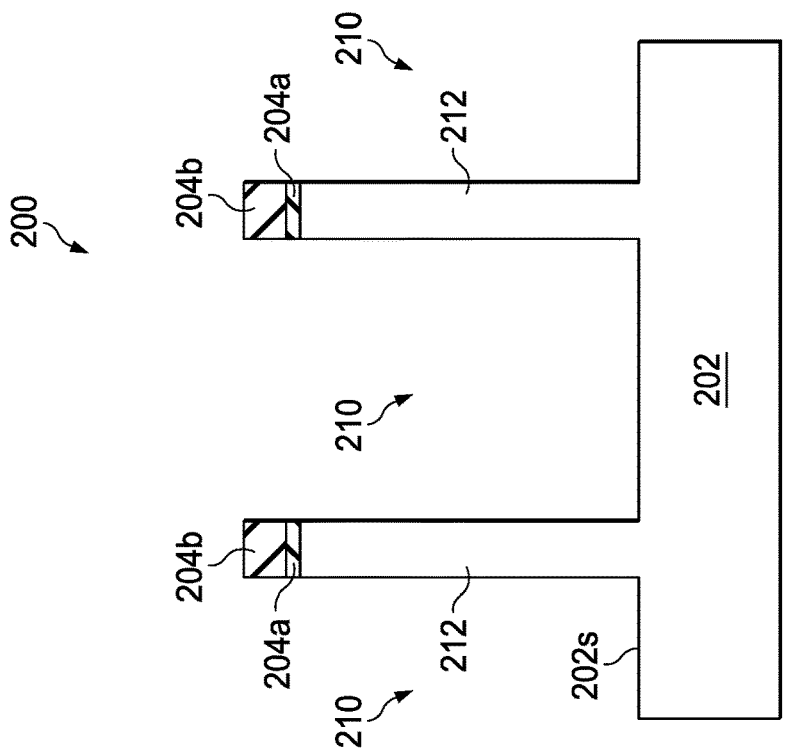
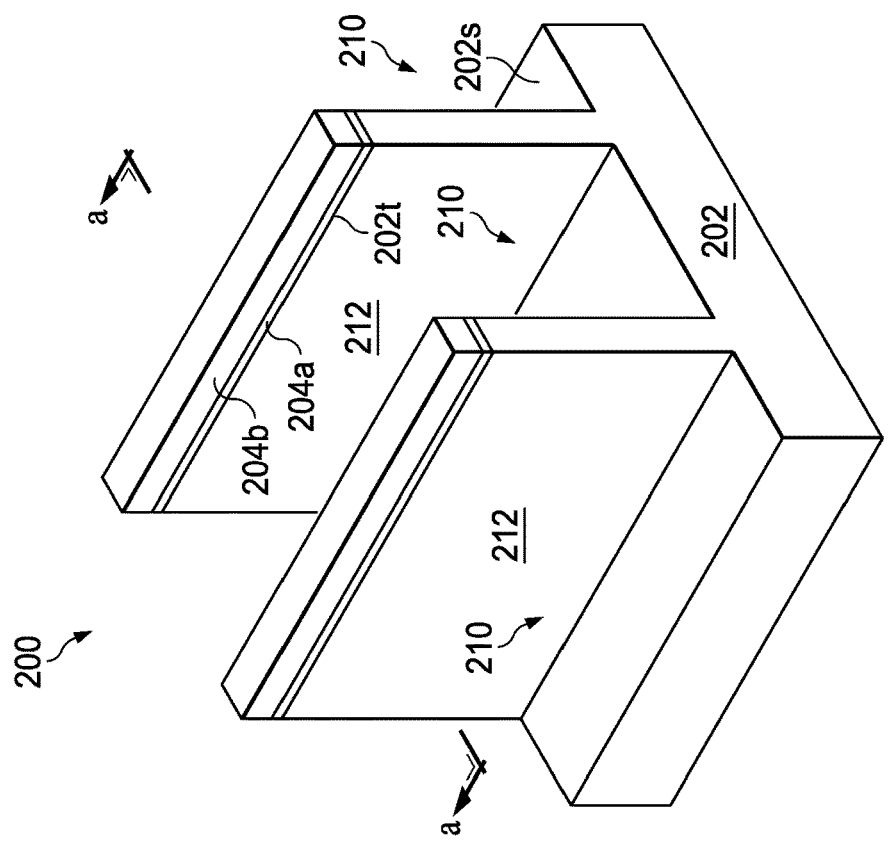
FIG. 3B
FIG. 3A

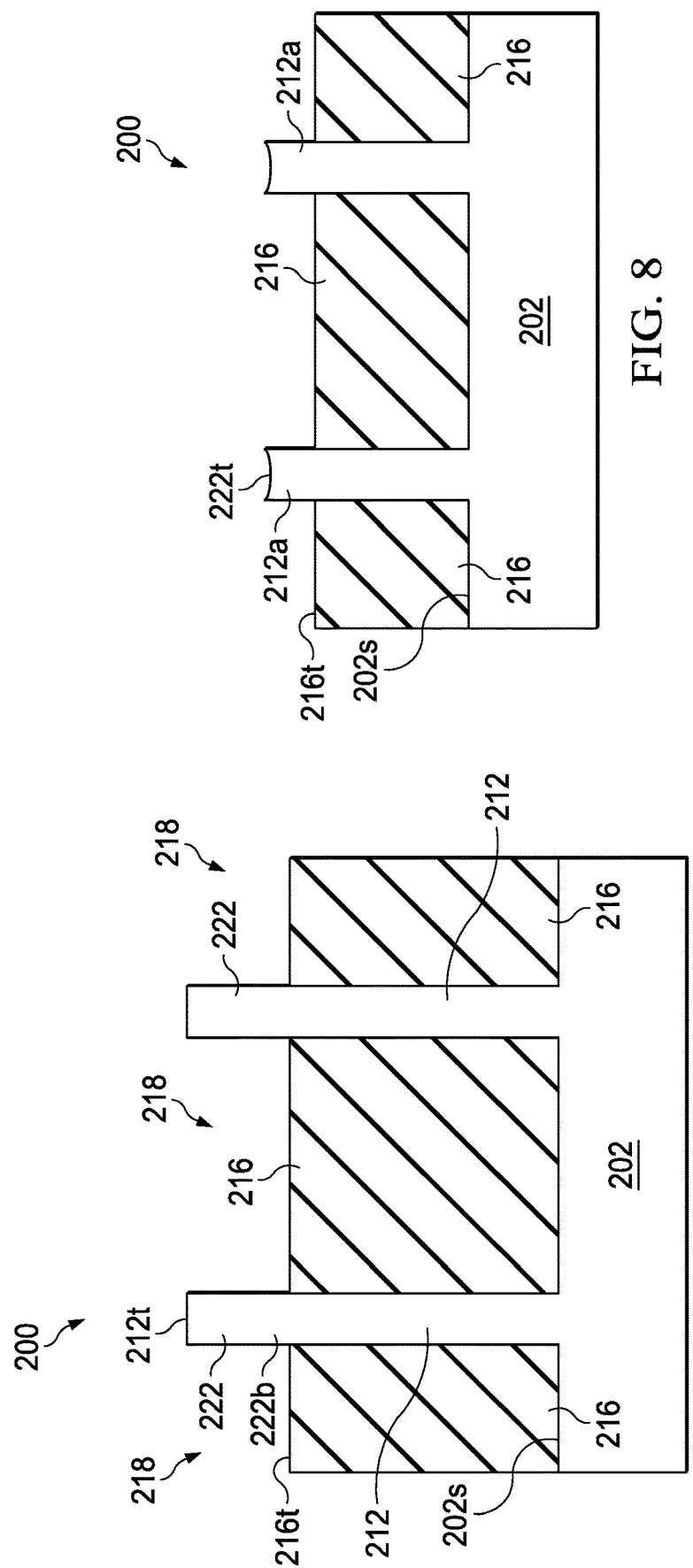

STRUCTURE OF A FIN FIELD EFFECT TRANSISTOR (FINFET)

PRIORITY CLAIM

This application is a continuation of U.S. patent application Ser. No. 16/222,583, filed Dec. 17, 2018, and entitled "Structure of a Fin Field Effect Transistor (FinFET)," which is a continuation of U.S. patent application Ser. No. 15/392,633, filed on Dec. 28, 2016, and entitled "Source/Drain Structure of a Fin Field Effect Transistor (FinFET)," and issued Dec. 18, 2018 as U.S. Pat. No. 10,158,006, which is a divisional of U.S. patent application Ser. No. 14/828,296, filed on Aug. 17, 2015, and entitled "Source/Drain Structure of Semiconductor Device," and issued on Jan. 3, 2017 as U.S. Pat. No. 9,537,008, which application is a continuation of U.S. patent application Ser. No. 14/144,198, filed on Dec. 30, 2013, and entitled "Source/Drain Structure of Semiconductor Device," and issued on Aug. 18, 2015 as U.S. Pat. No. 9,112,033 B2 which applications are incorporated herein by reference.

TECHNICAL FIELD

The disclosure relates to integrated circuit fabrication, and more particularly to a semiconductor device with a source/drain structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

However, there are challenges to implementation of such features and processes in complementary metal-oxide-semiconductor (CMOS) fabrication. For example, dislocation formation on merged source/drain epitaxial layers causes high leakage current of the FinFET, thereby degrading the device performance. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-12 are perspective and cross-sectional views of a semiconductor device comprising a source/drain structure at various stages of fabrication according to various embodiments of the present disclosure.

DETAILED DESCRIPTION

Figure 1:
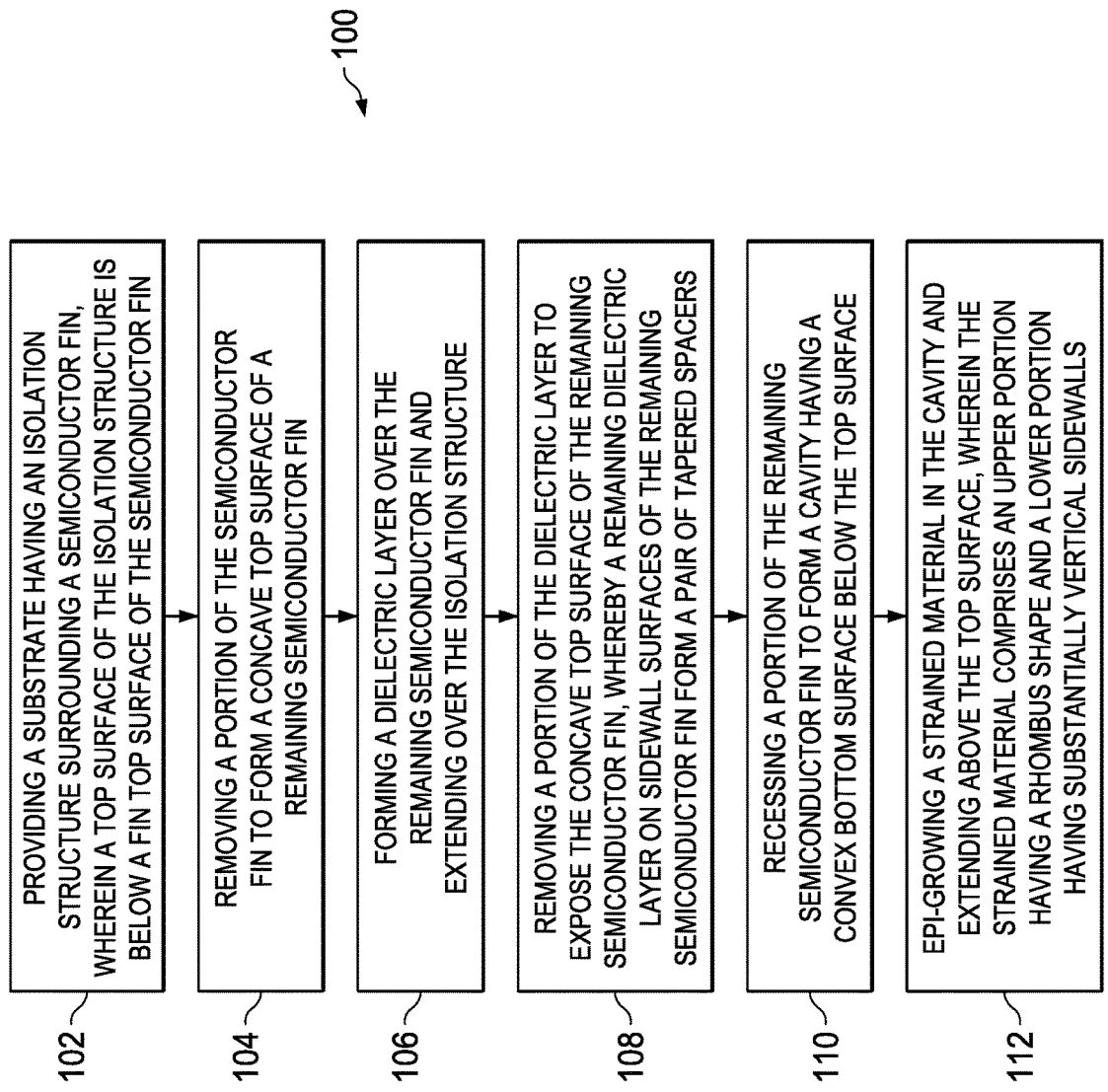
FIG. 1 is a flowchart illustrating a method of fabricating a source/drain structure of a semiconductor device according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a source/drain structure of a semiconductor device according to various aspects of the present disclosure. The method 100 begins with step 102 in which a substrate having an isolation structure surrounding a semiconductor fin is provided, wherein a top surface of the isolation structure is below a fin top surface of the semiconductor fin. The method 100 continues with step 104 in which a portion of the semiconductor fin is removed to form a concave top surface of a remaining semiconductor fin. The method 100 continues with step 106 in which a dielectric layer is formed over the remaining semiconductor fin and extending over the isolation structure.

The method 100 continues with step 108 in which a portion of the dielectric layer is removed to expose the concave top surface of the remaining semiconductor fin, whereby a remaining dielectric layer on sidewall surfaces of the remaining semiconductor fin forms a pair of tapered spacers. The method 100 continues with step 110 in which a portion of the remaining semiconductor fin is recessed to form a cavity having a convex bottom surface below the top surface. The method 100 continues with step 112 in which a strained material is epi-grown in the cavity and extending above the top surface, wherein the strained material comprises an upper portion having a rhombus shape and a lower portion having substantially vertical sidewalls. The discussion that follows illustrates embodiments of semiconductor devices that can be fabricated according to the method 100 of FIG. 1.

FIGS. 2A-12 are perspective and cross-sectional views of a semiconductor device 200 comprising a source/drain (S/D) structure 236 (shown in FIG. 12) at various stages of fabrication according to various embodiments of the present disclosure. As employed in the present disclosure, the term semiconductor device 200 refers to a fin field effect transistor (FinFET) and is hereinafter referred to as FinFET 200. The FinFET 200 refers to any fin-based, multi-gate transistor. Other transistor structures and analogous structures are within the contemplated scope of the disclosure. The FinFET 200 may be included in a microprocessor, memory cell, and/or other integrated circuit (IC).

It is noted that the method of FIG. 1 does not produce a completed FinFET 200. A completed FinFET 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 12 are simplified for a better understanding of the concepts of the present disclosure. For example, although the figures illustrate the FinFET 200, it is understood the IC may comprise a number of other devices comprising resistors, capacitors, inductors, fuses, etc.

Figure 2B:
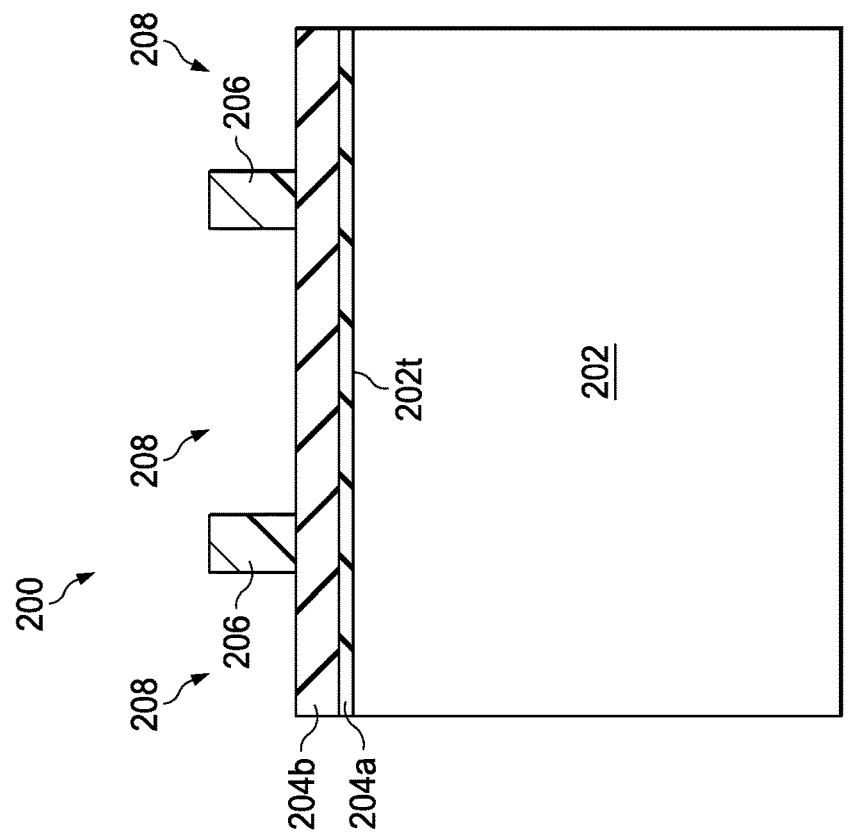
Figure 2A:
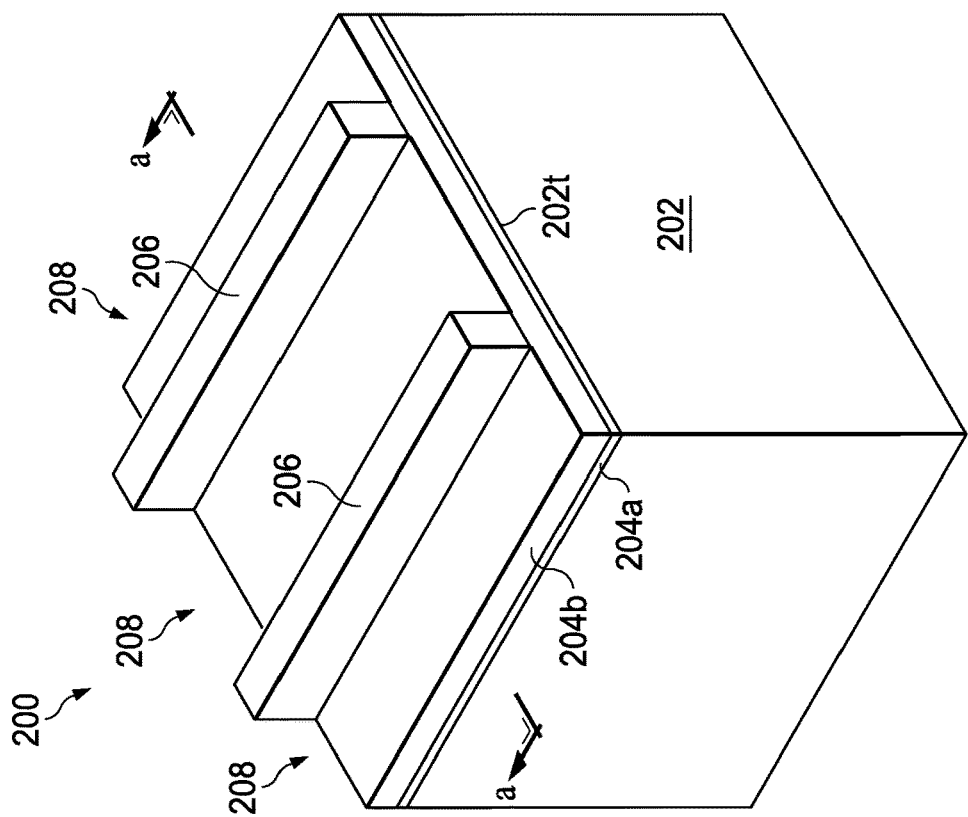

Referring to FIGS. 2A and 2B, and step 102 in FIG. 1, a substrate 202 on which an isolation structure 216 surrounding a semiconductor fin 212 will be formed, is provided. FIG. 2A is a perspective view of the semiconductor device 200 having a substrate 202 at one of the various stages of fabrication according to an embodiment, and FIG. 2B is a cross-sectional view of semiconductor device 200 taken along the line a-a of FIG. 2A.

In one embodiment, the substrate 202 comprises a semiconductor substrate (e.g., Si, SiGe, or SiGeB). In alternative embodiments, the substrate 202 comprises a silicon-on-insulator (SOI) structure. The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In one embodiment, a pad layer 204a and a mask layer 204b are formed on a top surface 202t of the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In an embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Referring to FIGS. 3A and 3B, after formation of the openings 208 in the photo-sensitive layer 206, the structure in FIGS. 3A and 3B is produced by forming semiconductor fins 212 in the substrate 202. FIG. 3A is a perspective view of the semiconductor device 200 at one of the various stages of fabrication according to an embodiment, and FIG. 3B is a cross-sectional view of semiconductor device 200 taken along the line a-a of FIG. 3A.

The mask layer 204b and pad layer 204a are etched through openings 208 to expose underlying semiconductor substrate 202. The exposed semiconductor substrate 202 is then etched to form trenches 210 with a major surface 202s of the semiconductor substrate 202. Portions of the semiconductor substrate 202 between trenches 210 form the semiconductor fins 212 protruding from a major surface 202s of the substrate 202. In some embodiments, the trenches 210 may be strips (viewed from in the top of the FinFET 200) parallel to each other, and closely spaced with respect to each other. In some embodiments, the trenches 210 may be continuous and surrounding the semiconductor fins 212.

In the depicted embodiment, the semiconductor fins 212 protruding from the major surface 202s comprises two fins.

The photo-sensitive layer 206 is then removed. Next, a cleaning may be performed to remove a native oxide of the semiconductor substrate 202. The cleaning may be performed using diluted hydrofluoric (DHF) acid.

Liner oxide (not shown) is then optionally formed in the trenches 210. In an embodiment, liner oxide may be a thermal oxide having a thickness ranging from about 20 Å to about 500 Å. In some embodiments, liner oxide may be formed using in-situ steam generation (ISSG) and the like. The formation of liner oxide rounds corners of the trenches 210, which reduces the electrical fields, and hence improves the performance of the resulting integrated circuit.

Figure 4B:
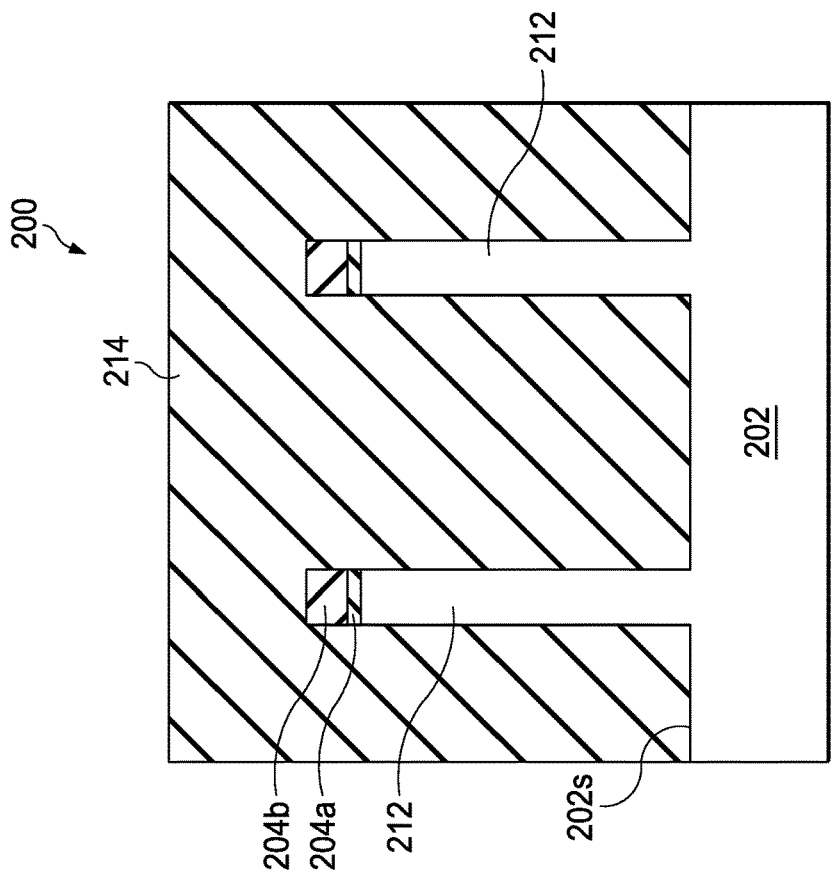
Figure 4A:
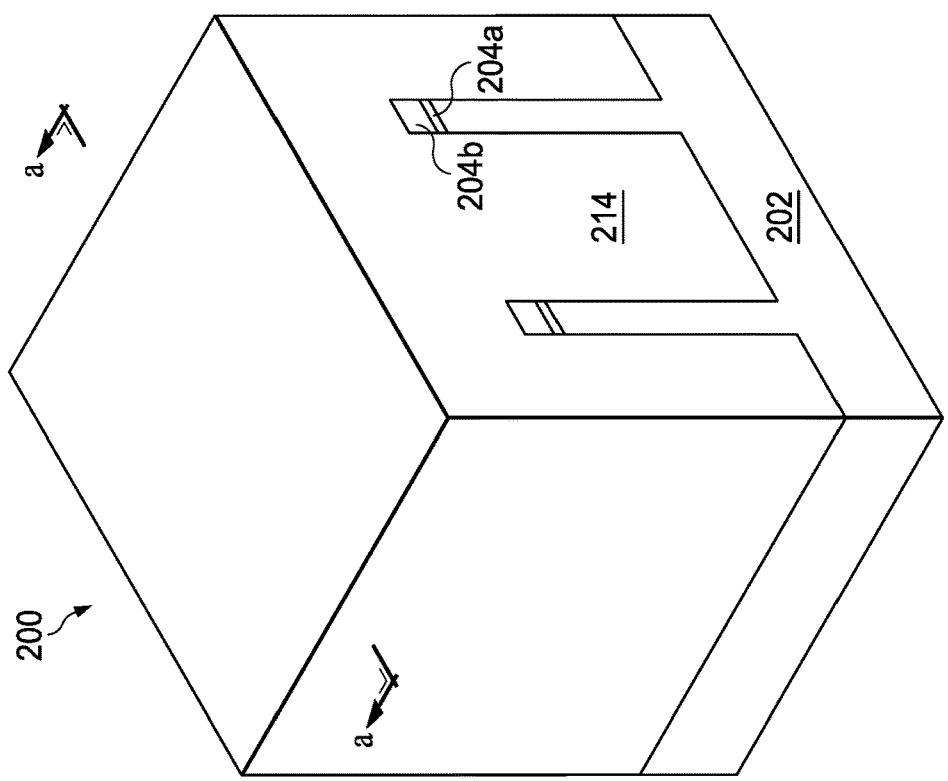

FIG. 4A is a perspective view of the semiconductor device 200 at one of the various stages of fabrication according to an embodiment, and FIG. 4B is a cross-sectional view of semiconductor device 200 taken along the line a-a of FIG. 4A. Trenches 210 are filled with a dielectric material 214. The dielectric material 214 may include silicon oxide, and hence is also referred to as oxide 214 in the present disclosure. In some embodiments, other dielectric materials, such as silicon nitride, silicon oxynitride, fluoride-doped silicate glass (FSG), or a low-K dielectric material, may also be used. In an embodiment, the oxide 214 may be formed using a high-density-plasma (HDP) CVD process, using silane ($SiH_4$) and oxygen ($O_2$) as reacting precursors. In other embodiment, the oxide 214 may be formed using a sub-atmospheric CVD (SACVD) process or high aspect-ratio process (HARP), wherein process gases may comprise tetraethylorthosilicate (TEOS) and ozone ($O_3$). In yet other embodiment, the oxide 214 may be formed using a spin-on-dielectric (SOD) process, such as hydrogen silsesquioxane (HSQ) or methyl silsesquioxane (MSQ).

Figure 5B:
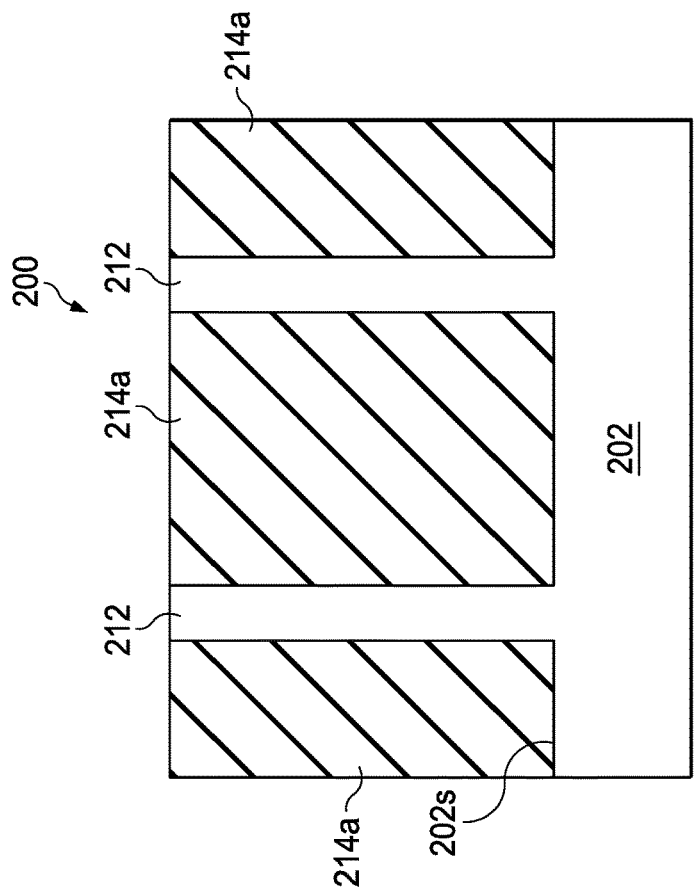
Figure 5A:
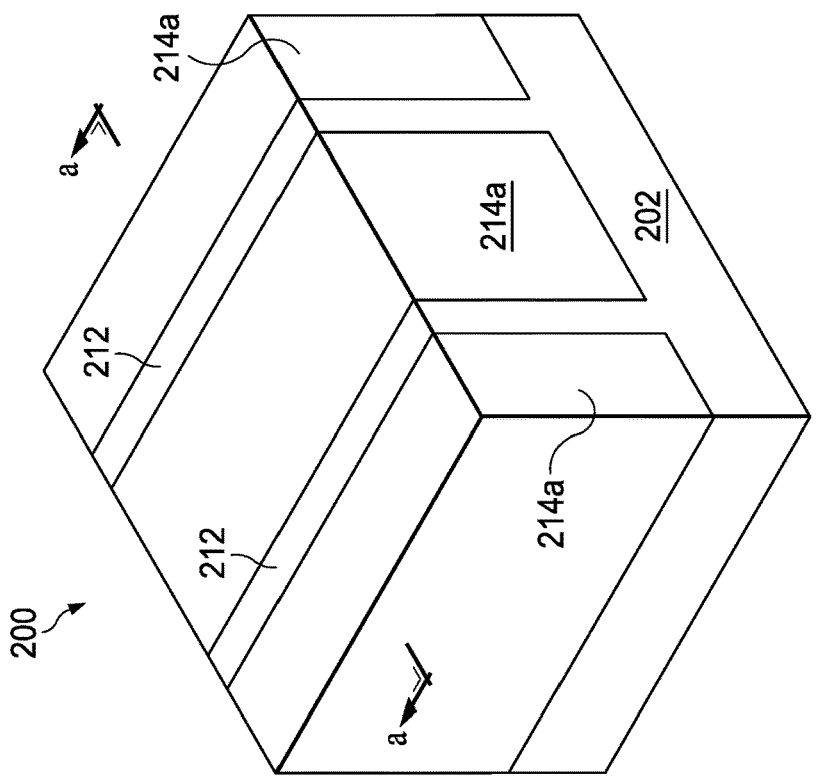

FIGS. 4A and 4B depict the resulting structure after the deposition of the dielectric material 214. A chemical mechanical polish is then performed, followed by the removal of the mask layer 204b and pad layer 204a. The resulting structure is shown in FIGS. 5A and 5B. FIG. 5A is a perspective view of the semiconductor device 200 at one of the various stages of fabrication according to an embodiment, and FIG. 5B is a cross-sectional view of semiconductor device 200 taken along the line a-a of FIG. 5A. The remaining portions of the oxide 214 in the trenches 210 are hereinafter referred to as insulation layers 214a. In one embodiment, the mask layer 204b is formed of silicon nitride, the mask layer 204b may be removed using a wet process using hot $H_3PO_4$, while pad layer 204a may be removed using diluted HF acid, if formed of silicon oxide. In some alternative embodiments, the removal of the mask layer 204b and pad layer 204a may be performed after the recessing of the insulation layers 214a, which recessing step is shown in FIGS. 6A and 6B.

Figure 6A:
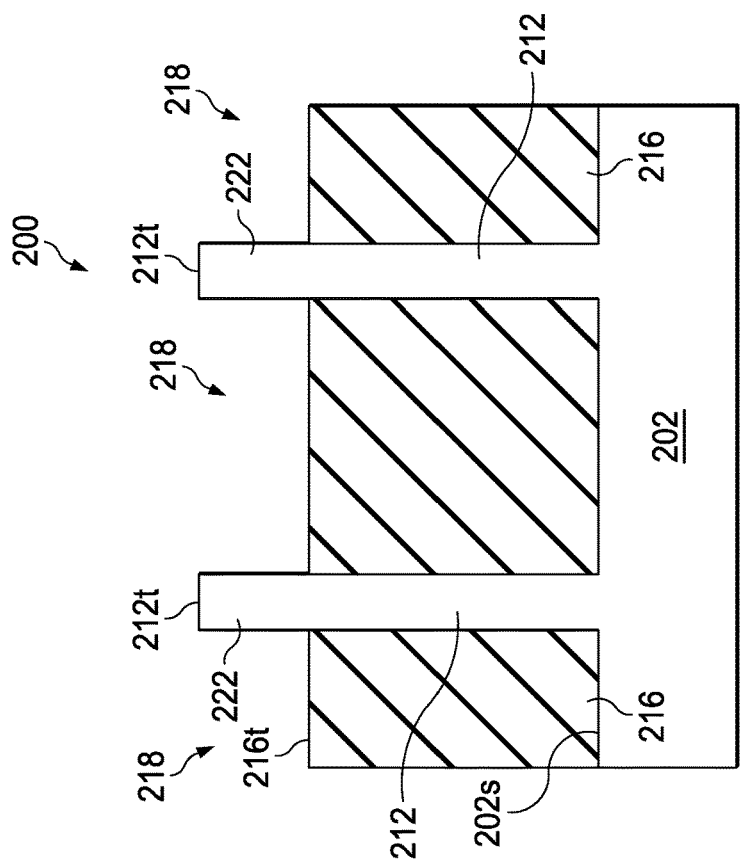
Figure 6B:
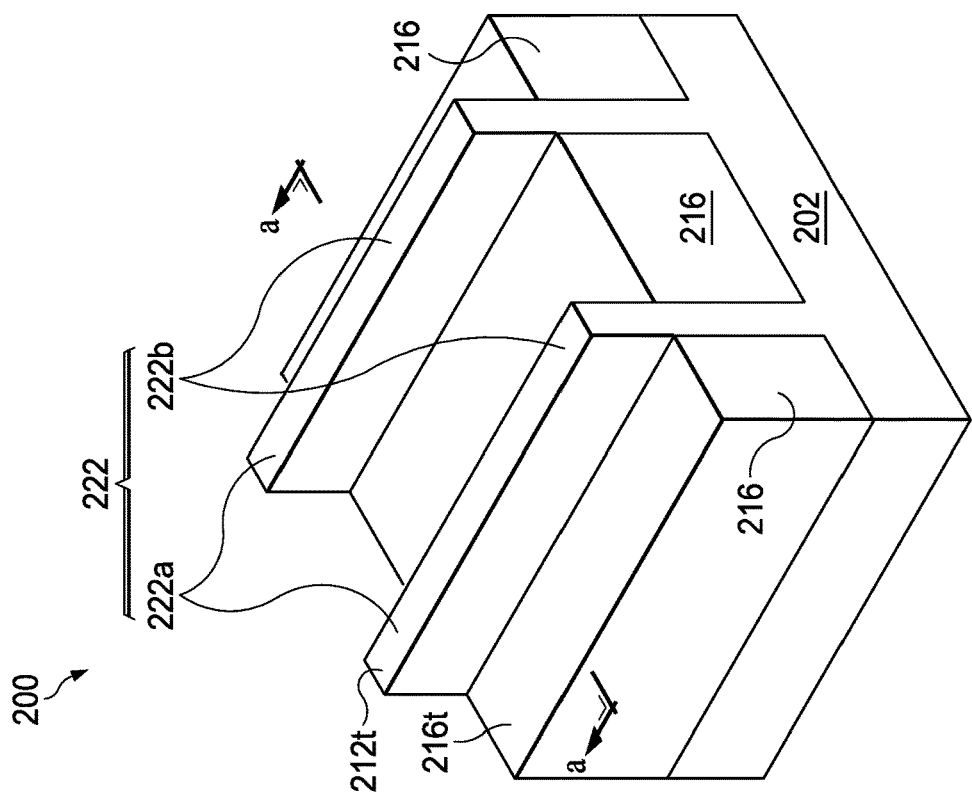

As shown in FIGS. 6A and 6B, after the removal of the mask layer 204b and pad layer 204a (or, optionally, before such removal), the insulation layers 214a are recessed by an etching step, resulting in recesses 218 and a remaining insulation layer (hereinafter referred to as an isolation structure 216), wherein a top surface 216t of the isolation structure 216 is over the major surface 202s and below a fin top surface 212t of the semiconductor fin 212. FIG. 6A is a perspective view of the semiconductor device 200 at one of the various stages of fabrication according to an embodiment, and FIG. 6B is a cross-sectional view of semiconductor device 200 taken along the line a-a of FIG. 6A.

In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

In the depicted embodiment, upper portions 222 of the semiconductor fins 212 extend downward from the fin top surface 212t to the top surface 216t. In some embodiments, a height of the upper portion 222 of the semiconductor fins 212 may be between 15 nm and about 50 nm, although it may also be greater or smaller. In the depicted embodiment, the upper portions 222 of the semiconductor fins 212 may comprise channel portions 222a and source/drain (S/D) portions 222b. The channel portions 222a are used to form channel regions of the semiconductor device 200.

Figure 7B:
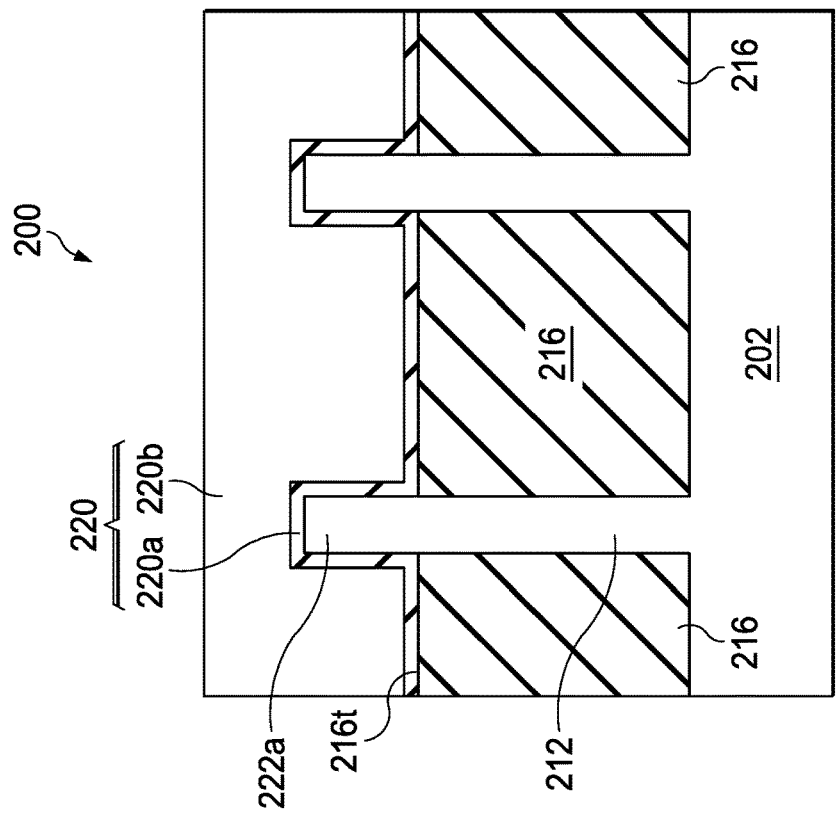
Figure 7A:
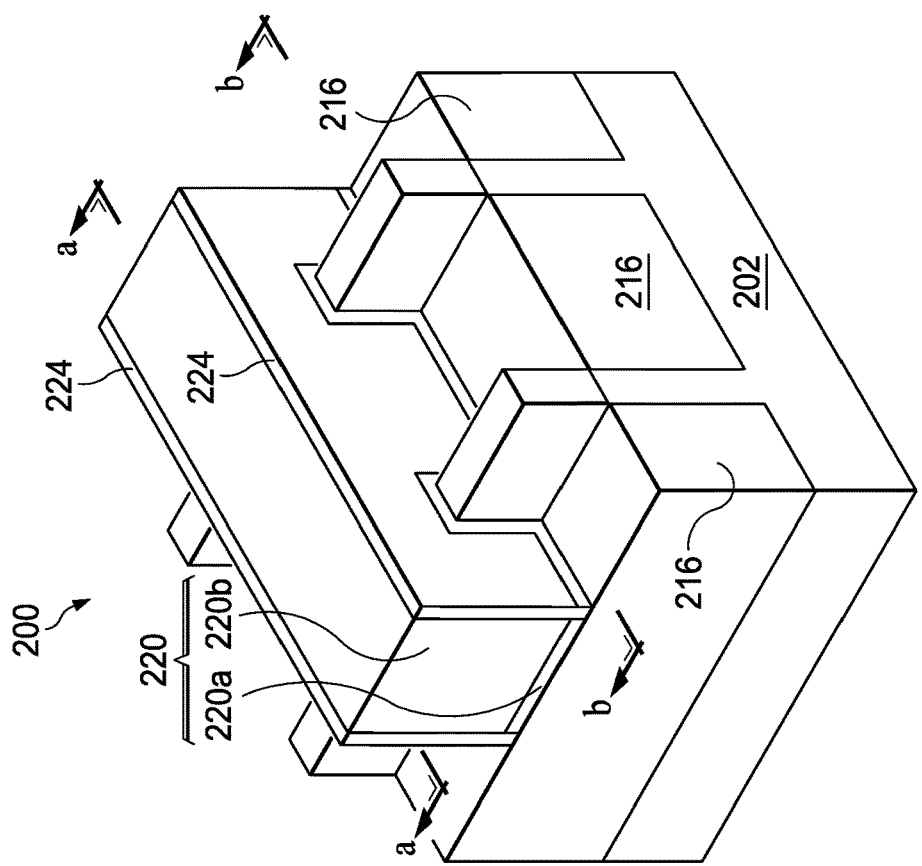

FIG. 7A is a perspective view of the semiconductor device 200 at one of the various stages of fabrication according to an embodiment, and FIG. 7B is a cross-sectional view of semiconductor device 200 taken along the line a-a of FIG. 7A. A gate stack 220 is formed over the channel portions 222a of the upper portions 222 of the semiconductor fins 212 and extending to the top surface 216t of the isolation structure 216. In some embodiments, the gate stack 220 typically comprises a gate dielectric layer 220a and a gate electrode layer 220b over the gate dielectric layer 220a.

In FIGS. 7A and 7B, a gate dielectric 220a is formed to cover the channel portions 222a of the upper portion 222 of the semiconductor fins 212. In some embodiments, the gate dielectric layer 220a may include silicon oxide, silicon nitride, silicon oxynitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 220a is a high-k dielectric layer with a thickness in the range of about 10 to 30 angstroms.

The gate dielectric layer 220a may be formed using a suitable process such as atomic layer deposition (ALD), chemical vapor deposition (CVD), physical vapor deposition (PVD), thermal oxidation, or UV-ozone oxidation. The gate dielectric layer 220a may further comprise an interfacial layer (not shown) to reduce damage between the gate dielectric layer 220a and channel portions 222a of the upper portions 222 of the semiconductor fins 212. The interfacial layer may comprise silicon oxide.

The gate electrode layer 220b is then formed on the gate dielectric layer 220a. In one embodiment, the gate electrode layer 220b covers the upper portions 222 of more than one semiconductor fin 212, so that the resulting semiconductor device 200 comprises more than one fin. In some alternative embodiments, each of the upper portions 222 of the semiconductor fins 212 may be used to form a separate semiconductor device 200. In some embodiments, the gate electrode layer 220b may comprise a single layer or multi-layer structure. In the present embodiment, the gate electrode layer 220b may comprise poly-silicon. Further, the gate electrode layer 220b may be doped poly-silicon with the uniform or non-uniform doping. In some alternative embodiments, the gate electrode layer 220b may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 220b comprises a thickness in the range of about 30 nm to about 60 nm. The gate electrode layer 220b may be formed using a suitable process such as ALD, CVD, PVD, plating, or combinations thereof.

Still referring to FIG. 7A, the semiconductor device 200 further comprises a dielectric layer 224 formed over the substrate 202 and along the side of the gate stack 220. In some embodiments, the dielectric layer 224 may include silicon oxide, silicon nitride, silicon oxy-nitride, or other suitable material. The dielectric layer 224 may comprise a single layer or multilayer structure. A blanket layer of the dielectric layer 224 may be formed by CVD, PVD, ALD, or other suitable technique. Then, an anisotropic etching is performed on the dielectric layer 224 to form a pair of spacers on two sides of the gate stack 220. The dielectric layer 224 comprises a thickness ranging from about 5 nm to about 15 nm.

The process steps up to this point have provided the substrate 202 having the gate stack 220 formed over the channel portions 222a of the upper portions 222, whereby the S/D portions 222b of the upper portions 222 are not covered by the gate stack 220. As such, a cross-sectional view of semiconductor device 200 taken along the line b-b of FIG. 7A (i.e., as shown in FIG. 7C) is the same as the cross-sectional view of semiconductor device 200 taken along the line a-a of FIG. 6A (i.e., as shown in FIG. 6B).

Conventionally, an epitaxial layer is selectively grown to cover the S/D portions 222b of the upper portions 222. The selective growth of the epitaxial layer over each S/D portions 222b continues until the epitaxial layer vertically extends a distance above the S/D portions 222b and laterally extends to merge each other over the top surfaces 216t of the insulation layer 216. In some embodiments, dislocation formation on the merged S/D epitaxial layer may cause high leakage current of the FinFET, thereby degrading the device performance.

Accordingly, the processing discussed below with reference to FIGS. 8-12 may form a pair of tapered spacers adjoining sidewalls of a S/D epitaxial layer. The pair of tapered spacers may enlarge the space between the adjacent S/D epitaxial layers to avoid dislocation formation on merged S/D epitaxial layer. As such, the S/D epitaxial layers may provide low leakage current of S/D regions of the semiconductor device, thereby enhancing the device performance.

As depicted in FIG. 8 and step 104 in FIG. 1, for fabricating a S/D structure (such as a S/D structure 236 shown in FIG. 12) of the semiconductor device 200, the structure in FIG. 8 is produced by removing a portion of the semiconductor fin 212 to form a concave top surface 222t of a remaining semiconductor fin 212a. FIG. 8 is a cross-sectional view of semiconductor device 200 taken along the line b-b of FIG. 7A at one of the various stages of fabrication according to an embodiment.

Using the gate stack 220 and the dielectric layer 224 as hard masks, a biased etching process is performed to recess the S/D portions 222b of the upper portions 222 of the semiconductor fins 212 that are unprotected or exposed to form the concave top surface 222t of the remaining semiconductor fin 212a higher than the top surface 216t of the isolation structure 216. In one embodiment, the etching process may be performed under a power of about 200 Watt to about 600 Watt and under a pressure of about 2 mTorr to about 20 mTorr, using HBr and $O_2$ as etch gases. In some embodiments, flow rate of HBr is between about 150 sccm to about 350 sccm, while flow rate of $O_2$ is between about 5 sccm to about 40 sccm.

Figure 9:
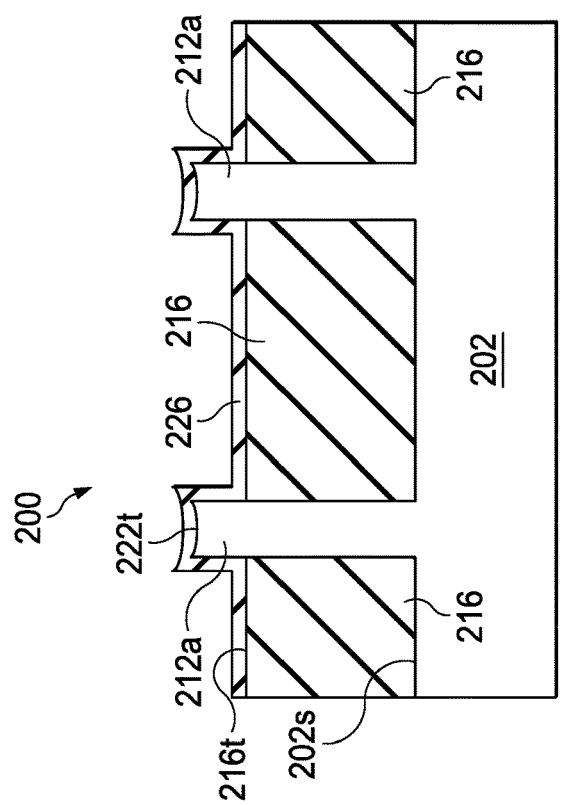

Referring to FIG. 9 and step 106 in FIG. 1, after the formation of the concave top surface 222t of the remaining semiconductor fin 212a, the structure in FIG. 9 is produced by forming a dielectric layer 226 over the remaining semiconductor fin 212a and extending over the isolation structure 216. FIG. 9 is a cross-sectional view of semiconductor device 200 taken along the line b-b of FIG. 7A at one of the various stages of fabrication according to an embodiment.

In some embodiments, the dielectric layer 226 may include silicon oxide, silicon nitride, silicon oxy-nitride, or other suitable material. The dielectric layer 226 may comprise a single layer or multilayer structure. A blanket layer of the dielectric layer 226 may be formed by CVD, PVD, ALD, or other suitable technique. The dielectric layer 226 comprises a thickness ranging from about 3 nm to about 8 nm.

Figure 10:
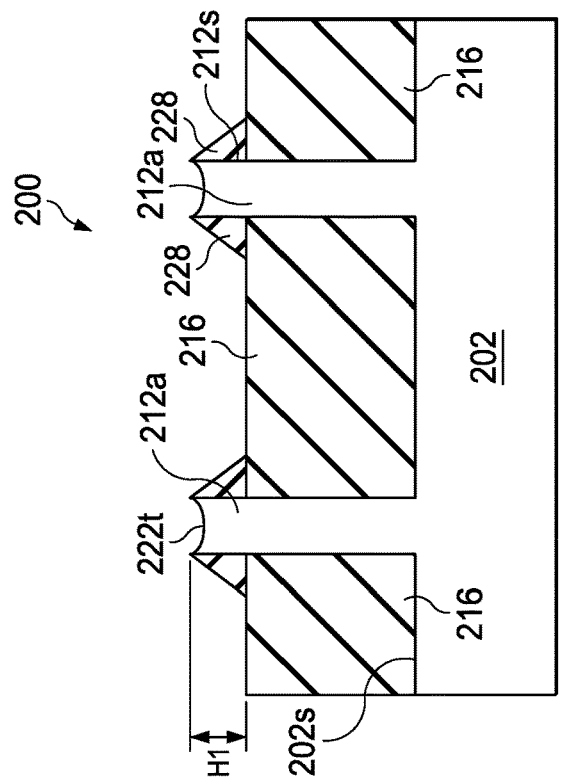

Then, an anisotropic etching process is performed on the dielectric layer 226 to remove a portion of the dielectric layer 226 to expose the concave top surface 222t of the remaining semiconductor fin 212a, whereby a remaining dielectric layer on sidewall surfaces 212s of the remaining semiconductor fin 212a forms a pair of tapered spacers 228 (FIG. 10 and step 108 in FIG. 1). The pair of tapered spacers 228 may enlarge the space between the adjacent S/D epitaxial layers (shown in FIG. 12). In some embodiments, the pair of tapered spacers 228 has a first height H1 ranging from about 5 nm to about 10 nm.

FIG. 10 is a cross-sectional view of semiconductor device 200 taken along the line b-b of FIG. 7A at one of the various stages of fabrication according to an embodiment. In one embodiment, the anisotropic etching process may be performed under a power of about 200 Watt to about 600 Watt and under a pressure of about 2 mTorr to about 20 mTorr, using $CF_4$ as etch gas. In some embodiments, flow rate of the $CF_4$ is between about 50 sccm to about 200 sccm.

Figure 12:
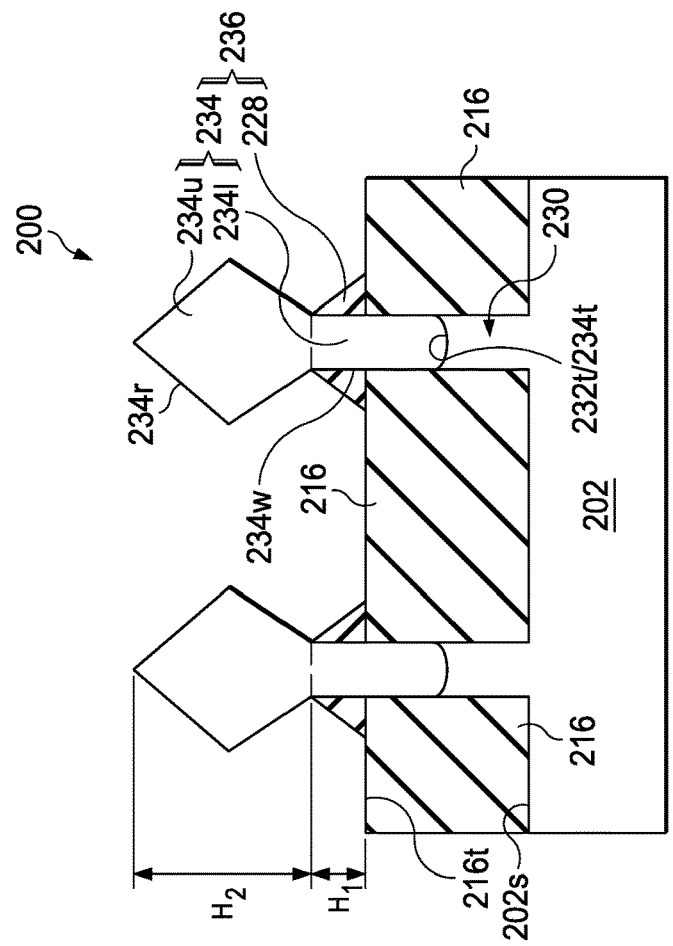
Figure 11:
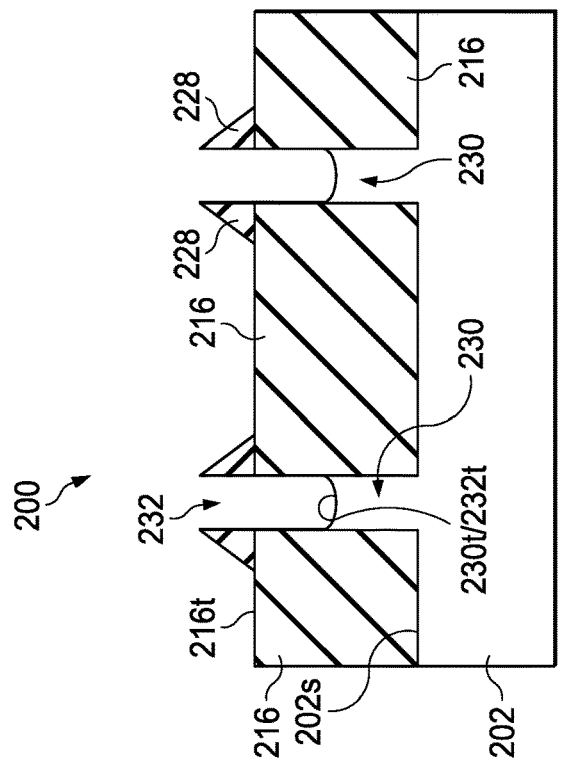

As depicted in FIGS. 11 and 12, upper portions of the remaining semiconductor fins 212a are replaced by other semiconductor material to enhance device performance. The structure in FIG. 11 is produced by recessing a portion of the remaining semiconductor fin 212a to form a cavity 232 having a convex bottom surface 232t below the top surface 216t (step 110 in FIG. 1). FIG. 11 is a cross-sectional view of semiconductor device 200 taken along the line b-b of FIG. 7A at one of the various stages of fabrication according to an embodiment.

Using the isolation structure 216 and the pair of tapered spacers 228 as hard masks, an anisotropic plasma etching process is performed to recess the remaining semiconductor fins 212a that are unprotected or exposed to form the cavity 232 between the neighboring isolation structures 216. The remaining portions of the remaining semiconductor fins 212a between the neighboring isolation structure 216 are hereinafter referred to as a fin structure 230, protruding from the major surface 202s of the substrate 202. In other words, the isolation structures 216 surround the fin structure 230. Further, the cavity 232 has the convex bottom surface 232t along a concave top surface 230t of the fin structure 230. In some embodiments, the etching process may be performed using a chemical selected from $Cl_2$, HBr, $NF_3$, $CF_4$, and $SF_6$ as an etching gas.

Next, the structures of FIG. 12 is produced by epi-growing a strained material 234 (i.e., S/D epitaxial layer 234) in the cavity 232 and extending above the top surface 216t, wherein the strained material 234 comprises an upper portion 234u having a rhombus shape 234r and a lower portion 234l having substantially vertical sidewalls 234w (step 112 in FIG. 1). As such, the pair of tapered spacers 228 adjoins a portion of the substantially vertical sidewalls 234w above the top surface 216t. In some embodiments, the lower portion 234l has a bottom surface 234t along the convex bottom surface 232t connecting the substantially vertical sidewalls 234w. FIG. 12 is a cross-sectional view of semiconductor device 200 taken along the line b-b of FIG. 7A at one of the various stages of fabrication according to an embodiment.

In some embodiments, the pair of tapered spacers 228 and the strained material 234 are combined and referred to as the S/D structure 236. In some embodiments, the strained material 234 comprises SiGe, SiC, or SiP. In some embodiments, a second height $H_2$ of the upper portion 234u is greater than the first height $H_1$ of the pair of tapered spacers 228. In some embodiments, a ratio of the second height $H_2$ to the first height $H_1$ is from 1.5 to 3.5.

In some embodiments, the strained material 234 comprises SiGe. In the depicted embodiment, the strained material 234 such as SiGe is selectively grown by an LPCVD process to fill the cavity 232. In one embodiment, the LPCVD process is performed at a temperature of about 400 to about 800° C. and under a pressure of about 1 to about 200 Torr, using $SiH_2Cl_2$, $SiH_4$, $GeH_4$, HCl, $B_2H_6$, and $H_2$ as reaction gases.

As such, using the pair of tapered spacers 228 to enlarge the space between the adjacent S/D epitaxial layers 234, problems associated with high leakage current due to dislocation formation on merged S/D epitaxial layer may be reduced and/or avoided. Thus, Applicant's method may achieve the desired device performance characteristics, such as low leakage current.

After the steps shown in FIG. 1, as further illustrated with respect to the example depicted in FIGS. 2A-12, have been performed, subsequent processes, comprising interconnect processing, are typically performed to complete the semiconductor device 200 fabrication.

In accordance with one embodiment, a method includes etching a top portion of a first semiconductor fin to produce a recessed top portion of the first semiconductor fin. The recessed top portion protrudes from an isolation structure which is adjacent to the first semiconductor fin. A dielectric layer is deposited over the first semiconductor fin and the isolation structure and etched to expose a top surface of the recessed top portion. Etching the dielectric layer produces a pair of spacers on either side of the recessed top portion. The spacers are in contact with sidewalls of the recessed top portion. The method also includes etching the first semiconductor fin to recess the top surface of the recessed top portion to produce a recessed top surface of the first semiconductor fin. The recessed top surface is recessed below a top surface of the isolation structure. A source/drain material is epitaxially grown on the recessed top surface. The source/drain material is formed between the pair of spacers and expands laterally over the pair of spacers.

In accordance with another embodiment, a method includes forming a fin structure extending from a top surface of a dielectric layer and forming a gate structure over a first portion of the fin structure. A first source/drain region on one side of the gate structure is left uncovered by the gate structure and a second source/drain region on another side of the gate structure is also left uncovered by the gate structure. The method includes etching back the first source/drain region to form a recessed first source/drain region and etching back the second source/drain region to form a recessed second source/drain region. A first spacer is formed that extends from a top of the recessed first source/drain region to the top surface of the dielectric layer, and a second spacer is formed that extends from a top of the second source/drain region to the top surface of the dielectric layer. The recessed first source/drain region is etched back to below the top surface of the dielectric layer to form a further recessed first source/drain region having a first concave upper surface, and the recessed second source/drain region is etched back to below the top surface of the dielectric layer to form a further recessed second source/drain region having a concave upper surface. The method also includes epitaxially growing a strained material atop the first concave upper surface. The strained material has a first region with substantially straight sidewalls and a second region with sidewalls that expand laterally outwards.

In accordance with another embodiment, a method includes forming a plurality of cavities in an isolation structure. Each cavity is deeper in a middle of the cavity than at the edges of the cavity, and the bottom of each cavity is made of semiconductor fin material. An epitaxy is epitaxially grown in each cavity. Each epitaxy extends through a neck of a respective pair of spacers and extends laterally over the respective pair of spacers wider than a width of the cavity. The respective pair of spacers are formed over each cavity adjacent each cavity opening and extend vertically from a top surface of the isolation structure.

In accordance with another embodiment, a fin field effect transistor (FinFET) comprises an isolation structure comprising a top surface over a substrate major surface; a cavity having a convex bottom surface below the top surface; a strained material in the cavity and extending above the top surface, wherein the strained material comprises an upper portion having a rhombus shape and a lower portion having substantially vertical sidewalls; and a pair of tapered spacers adjoining a portion of the substantially vertical sidewalls above the top surface.

In accordance with another embodiment, a fin field effect transistor (FinFET) comprises a substrate comprising a major surface; a fin structure protruding from the major surface; an isolation structure surrounding the fin structure, wherein a top surface of the isolation structure is over the major surface; a cavity having a convex bottom surface below the top surface and along a concave top surface of the fin structure; a strained material in the cavity and extending above the top surface, wherein the strained material comprises an upper portion having a rhombus shape and a lower portion having substantially vertical sidewalls; and a pair of tapered spacers adjoining a portion of the substantially vertical sidewalls above the top surface.

In accordance with another embodiments, a method of fabricating a fin field effect transistor (FinFET) comprises providing a substrate having an isolation structure surrounding a semiconductor fin, wherein a top surface of the isolation structure is below a fin top surface of the semiconductor fin; removing a portion of the semiconductor fin to form a concave top surface of a remaining semiconductor fin; forming a dielectric layer over the remaining semiconductor fin and extending over the isolation structure; removing a portion of the dielectric layer to expose the concave top surface of the remaining semiconductor fin, whereby a remaining dielectric layer on sidewall surfaces of the remaining semiconductor fin forms a pair of tapered spacers; recessing a portion of the remaining semiconductor fin to form a cavity having a convex bottom surface below the top surface; and epi-growing a strained material in the cavity and extending above the top surface, wherein the strained material comprises an upper portion having a rhombus shape and a lower portion having substantially vertical sidewalls.

One embodiment is a fin field effect transistor (FinFET) including a fin extending from a substrate, where the fin includes a lower region, a mid region over the lower region, the mid region having a first interface with the lower region, and an upper region over the mid region, the upper region having a second interface with the mid region, the upper region having sidewalls that extend laterally beyond sidewalls of the mid region. The FinFET also includes a gate stack disposed over a channel region of the fin, the gate stack including a gate dielectric, a gate electrode, and a gate spacer on either side of the gate stack. A dielectric material is included that surrounds the lower region and the first interface. A fin spacer is included which is disposed on the sidewalls of the mid region, the fin spacer tapering from a top surface of the dielectric material to the second interface, where the fin spacer is a distinct layer from the gate spacers.

Another embodiment is a fin field effect transistor (FinFET) including a lower fin portion of a fin extending from a top surface of a substrate and a middle fin portion of the fin extending from the lower fin portion, where the middle fin portion has an isolation structure defining lower sidewalls thereof and a spacer structure defining upper sidewalls thereof, and where the spacer structure extends above an uppermost surface of the isolation structure. The FinFET also includes an upper fin portion of the fin extending from the middle fin portion, the upper fin portion expanding laterally beyond the upper sidewalls of the middle fin portion. A gate spacer is included which is disposed on either side of a gate stack, the gate stack disposed over a channel region of the fin, where the gate spacer has a portion which is separate from the spacer structure.

Another embodiment is a fin field effect transistor (FinFET) including an isolation layer disposed over a substrate and a fin structure extending from a major surface of a substrate, where the fin structure is laterally surrounded by the isolation layer. An epitaxial lower fin region is included which extends from the fin structure, where a first interface of the fin structure and the epitaxial lower fin region is surrounded by the isolation layer. A fin spacer is disposed over a top surface of the isolation layer and laterally surrounds a portion of the epitaxial lower fin region. An epitaxial upper fin region extends from the epitaxial lower fin region, the epitaxial upper fin region extending laterally beyond sidewalls of the epitaxial lower fin region. A gate structure is disposed over the fin, the gate structure disposed adjacent to the epitaxial upper fin region. The gate structure includes a gate spacer where the gate spacer is distinct from the fin spacer.

In one aspect, the disclosed embodiments may provide for a fin field effect transistor (FinFET). The FinFET includes a fin extending from a major surface of a substrate. The fin includes a lower region having a concave top surface, a mid region having a convex bottom surface that mates with the concave top surface of the lower region, the mid region having sidewalls, and an upper region forming an interface with the mid region, the upper region having sidewalls that extend laterally beyond the sidewalls of the mid region. The FinFET also includes a dielectric material that surrounds the lower region and surrounds a portion of the mid region, the dielectric material having a top surface, and a spacer surrounding having sloping sidewalls extending from the interface to the top surface of the dielectric material.

In another aspect, embodiments discloses herein may provide for a method that includes forming a fin structure extending from a top surface of a dielectric layer and forming a gate structure over a first portion of the fin structure, leaving a first source/drain region on one side of the gate structure uncovered by the gate structure and a second source/drain region on another side of the gate structure uncovered by the gate structure. The method further includes etching back the first source/drain region to form a recessed first source/drain region, and etching back the second source/drain region to form a recessed second source/drain region. A first spacer is formed extending from a top of the recessed first source/drain region to the top surface of the dielectric layer, and forming a second spacer extending from a top of the second source/drain region to the top surface of the dielectric layer. The method further includes etching back the recessed first source/drain region to below the top surface of the dielectric layer to form a further recessed first source/drain region having a first concave upper surface, and etching back the recessed second source/drain region to below the top surface of the dielectric layer to form a further recessed second source/drain region having a concave upper surface, and epitaxially growing a strained material atop the first concave upper surface. The strained material has a first region with substantially straight sidewalls and a second region with sidewalls that expand laterally outwards.

In yet another aspect, embodiments disclosed herein may provide for a fin field effect transistor (FinFET) having a fin extending from a major surface of a substrate. The fin extends along a first direction parallel to the major surface of the substrate. The fin includes, extending along the first direction, a source region, a channel region, and a drain region. The FinFET also includes a gate structure including a gate dielectric and a gate electrode that extends over the channel region. The source region includes a lower portion extending from a top surface of the substrate and having a concave top surface, a middle portion extending from the lower portion, the middle portion having an isolation structure defining lower sidewalls thereof and a spacer structure defining upper sidewalls thereof, the spacer structure extending above an uppermost surface of the isolation structure, and an upper portion extending from the middle portion, the upper portion having sidewalls that extend expand laterally beyond a lateral boundary defined by the upper sidewalls of the middle portion.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method comprising:
   forming a first semiconductor fin protruding from a substrate;
   depositing an isolation structure over the first semiconductor fin;
   recessing an upper surface of the isolation structure, causing the first semiconductor fin to protrude from the isolation structure;
   depositing a dielectric layer over the first semiconductor fin and the isolation structure;
   etching the dielectric layer to expose an upper surface of the first semiconductor fin, wherein etching the dielectric layer produces a pair of spacers on opposing sides of the first semiconductor fin, wherein the pair of spacers are in contact with sidewalls of the first semiconductor fin;
   etching the first semiconductor fin to recess the upper surface of the first semiconductor fin below the upper surface of the isolation structure; and
   epitaxially growing a source/drain material on the recessed upper surface of the first semiconductor fin, wherein the source/drain material is formed between the pair of spacers.

2. The method of claim 1, further comprising:
   prior to depositing the dielectric layer, recessing the first semiconductor fin.

3. The method of claim 2, wherein recessing the first semiconductor fin causes the top surface of the semiconductor fin to become concave.

4. The method of claim 1, further comprising:
   continuing to grow the source/drain material, wherein the source/drain material expands laterally over the pair of spacers.

5. The method of claim 1, wherein a width of a first spacer of the pair of spacers is narrower at an upper portion of the first spacer than at a lower portion of the first spacer.

6. The method of claim 1, wherein after etching the first semiconductor fin, the upper surface of the first semiconductor fin is concaved.

7. The method of claim 1, wherein etching the dielectric layer is performed by an anisotropic etching process.

8. The method of claim 1, wherein the epitaxially grown source/drain material is strained.

9. The method of claim 1, wherein an upper portion of the epitaxially grown source/drain material above the pair of spacers is elevated above the upper surface of the isolation structure by a distance between 29% and 66% of a height of the upper portion.

10. A method comprising:
    depositing an isolation structure over a first semiconductor fin, the first semiconductor fin protruding from a substrate;
    recessing an upper surface of the isolation structure to cause an upper portion of the first semiconductor fin to protrude from the isolation structure;
    forming a pair of spacers on opposing sides of the upper portion of the first semiconductor fin;
    recessing the first semiconductor fin between the pair of spacers; and
    epitaxially growing a source/drain material on the recessed first semiconductor fin, wherein the source/drain material is grown between the pair of spacers.

11. The method of claim 10, wherein an upper portion of the source/drain material protrudes from between the pair of spacers, wherein a height of the upper portion is between 1.5 and 3.5 times greater than a height of the pair of spacers.

12. The method of claim 10, wherein forming the pair of spacers comprises:
    depositing a dielectric material over the upper portion of the first semiconductor fin; and
    anisotropically etching the dielectric material to remove horizontal portions of the dielectric material while leaving vertical portions of the dielectric material as forming the pair of spacers.

13. The method of claim 10, wherein after recessing the first semiconductor fin, an upper surface of the first semiconductor fin is concaved.

14. The method of claim 10, wherein after recessing the first semiconductor fin, an upper surface of the first semiconductor fin is below the upper surface of the isolation structure.

15. The method of claim 10, wherein each spacer of the pair of spacers has a same height.

16. A method, comprising:
- forming a blanket dielectric layer over an isolation structure and over a semiconductor fin protruding from the isolation structure;
- etching the blanket dielectric layer to form a pair of spacers on the semiconductor fin, one spacer of the pair of spacers on each side of opposing sides of the semiconductor fin, wherein the semiconductor fin protrudes from an isolation structure, wherein the pair of spacers contacts a top surface of the isolation structure;
- etching the semiconductor fin below the top surface of the isolation structure to form a cavity in the isolation structure, a bottom of the cavity comprising a remaining portion of the semiconductor fin; and
- epitaxially growing a semiconductor material in the cavity, wherein the semiconductor material extends through a neck of the pair of spacers and extends laterally over the pair of spacers wider than a width of the cavity.

17. The method of claim 16, wherein a height of the semiconductor material above the pair of spacers is between 1.5 and 3.5 times a height of the pair of spacers.

18. The method of claim 16, wherein each spacer of the pair of spacers is narrower at its top than at its base.

19. The method of claim 16, wherein the pair of spacers comprise silicon oxide, silicon nitride, or silicon oxynitride.

20. The method of claim 16, wherein an interface between the remaining portion of the semiconductor fin and the epitaxially grown semiconductor material is not horizontal.

* * * * *